(12) United States Patent
Swaminathan et al.

(10) Patent No.: US 10,573,498 B2
(45) Date of Patent: Feb. 25, 2020

(54) SUBSTRATE PROCESSING APPARATUS INCLUDING ANNULAR LAMP ASSEMBLY

(71) Applicant: APPLIED MATERIALS, INC., Santa Clara, CA (US)

(72) Inventors: Bharath Swaminathan, San Jose, CA (US); Hanbing Wu, Millbrae, CA (US); John Mazzocco, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/402,142

(22) Filed: Jan. 9, 2017

(65) Prior Publication Data

US 2018/0197721 A1    Jul. 12, 2018

(51) Int. Cl.
*H01L 21/31* (2006.01)
*H01L 21/469* (2006.01)
(Continued)

(52) U.S. Cl.
CPC ........ *H01J 37/32522* (2013.01); *C23C 14/34* (2013.01); *C23C 14/505* (2013.01);
(Continued)

(58) Field of Classification Search
CPC ........... H01J 37/32522; H01J 37/32715; H01J 37/3411; C23C 14/34; C23C 14/505
See application file for complete search history.

(56) References Cited

U.S. PATENT DOCUMENTS 5,198,034 A * 3/1993 deBoer .................. B05C 11/08
118/500
6,367,410 B1 * 4/2002 Leahey ............. H01L 21/67103
118/58
(Continued)

FOREIGN PATENT DOCUMENTS

KR        10-0375396 B1    5/2003
WO        WO 99-49101 A1   9/1999

OTHER PUBLICATIONS

U.S. Appl. No. 15/337,942, filed Oct. 28, 2016, Swaminathan et al.
(Continued)

*Primary Examiner* — Matthew E. Gordon
(74) *Attorney, Agent, or Firm* — Moser Taboada; Alan Taboada (57) ABSTRACT

Embodiments of a method and apparatus for annealing a substrate are disclosed herein. In some embodiments, a substrate support includes a substrate support pedestal having an upper surface to support a substrate and an opposing bottom surface, wherein the substrate support pedestal is formed of a material that is transparent to radiation; a lamp assembly disposed below the substrate support pedestal and having a plurality of lamps configured to heat the substrate; a pedestal support extending through the lamp assembly to support the substrate support pedestal in a spaced apart relation to the plurality of lamps; a shaft coupled to a second end of the pedestal support opposite the first end; and a rotation assembly coupled to the shaft opposite the pedestal
(Continued)

support to rotate the shaft, the pedestal support, and the substrate support pedestal with respect to the lamp assembly.

10 Claims, 5 Drawing Sheets

(51) Int. Cl.
    *H01J 37/32*     (2006.01)
    *H01L 21/687*     (2006.01)
    *C23C 14/34*     (2006.01)
    *C23C 14/50*     (2006.01)
    *H01J 37/34*     (2006.01)

(52) U.S. Cl.
    CPC ..... *H01J 37/32715* (2013.01); *H01J 37/3411* (2013.01); *H01L 21/68742* (2013.01); *H01L 21/68785* (2013.01); *H01J 2237/332* (2013.01)

(56) References Cited

U.S. PATENT DOCUMENTS

| | | | | |
|---|---|---|---|---|
| 2002/0104205 A1* | 8/2002 | Goodwin | .......... | H01L 21/67115 29/25.01 |
| 2007/0289534 A1* | 12/2007 | Lubomirsky | ......... | C23C 16/452 118/723 R |
| 2011/0052833 A1 | 3/2011 | Hanawa et al. | | |
| 2013/0186338 A1* | 7/2013 | Tsai | ...................... | C23C 14/541 118/725 |
| 2013/0270107 A1* | 10/2013 | Ewert | .................... | C23C 14/541 204/298.09 |
| 2013/0284096 A1 | 10/2013 | Goel et al. | | |
| 2014/0072726 A1* | 3/2014 | Kim | ........................ | C23C 16/50 427/569 |
| 2014/0254150 A1 | 9/2014 | Ranish et al. | | |
| 2014/0263169 A1 | 9/2014 | Lee et al. | | |
| 2014/0263271 A1* | 9/2014 | Sheelavant | ....... | H01L 21/67115 219/443.1 |
| 2015/0170952 A1* | 6/2015 | Subramani | ............. | H02N 13/00 361/234 |
| 2015/0340257 A1* | 11/2015 | Brillhart | ........... | H01L 21/67201 392/416 |

OTHER PUBLICATIONS

International Search Report and Written Opinion dated May 4, 2018 for PCT Application No. PCT/US2018/012191.

* cited by examiner

SUBSTRATE PROCESSING APPARATUS INCLUDING ANNULAR LAMP ASSEMBLY

FIELD

Embodiments of the present disclosure generally relate to semiconductor substrate processing.

BACKGROUND

Formation of some devices on substrates (e.g., STT-RAM) requires multiple layers of thin films which are deposited in a deposition chamber, such as a physical vapor deposition (PVD) chamber. In some embodiments, the substrate needs to be rotated during the deposition process to obtain good film uniformity. For example, when the deposition process uses multiple cathodes and targets that are disposed off-axis with respect to the substrate to deposit the different materials, the substrate needs to be rotated to ensure good film uniformity. Deposition of some layers may also require the substrate to be at a low temperature and, subsequently, annealed. However, typical substrate supports include a pedestal that retains temperature when heated to high temperatures. As such, the pedestal must be allowed to cool down before any further low temperature processes are conducted. As a result, throughput is negatively impacted.

To avoid such chamber downtime, the substrate may be transferred to a separate anneal chamber, which may be coupled to the same cluster tool as the PVD chamber. However, the inventors have observed a need for in-situ anneal to improve the throughput of the PVD chamber. The inventors have also observed a need for an ex-situ anneal chamber that heats a substrate in a more uniform manner than conventional anneal chambers.

Therefore, the inventors have provided embodiments of improved methods and apparatus for processing substrates.

SUMMARY

Embodiments of methods and apparatus for processing a substrate are disclosed herein. In some embodiments, a substrate support includes: a substrate support pedestal having an upper surface to support a substrate and an opposing bottom surface, wherein the substrate support pedestal is formed of a material that is transparent to radiation; a lamp assembly disposed below the substrate support pedestal and having a plurality of lamps configured to heat the substrate, wherein the lamp assembly includes a central hole; a pedestal support extending through the central hole and coupled to the bottom surface of the substrate support pedestal at a first end of the pedestal support to support the substrate support pedestal in a spaced apart relation to the plurality of lamps; a shaft coupled to a second end of the pedestal support opposite the first end; and a rotation assembly coupled to the shaft opposite the pedestal support to rotate the shaft, the pedestal support, and the substrate support pedestal with respect to the lamp assembly.

In some embodiments, a substrate anneal chamber includes: a chamber body having a chamber wall and an interior volume; a lamp assembly disposed in the interior volume and having a plurality of lamps configured to heat a substrate, wherein the lamp assembly is coupled to a shaft which supports the lamp assembly; a plurality of lift pins extending through the lamp assembly to support the substrate in a spaced apart relation to the plurality of lamps; a slit valve disposed through a wall of the chamber body and above the lamp assembly to allow the substrate to pass into and out of the interior volume; an annular lamp assembly having at least one lamp disposed in an upper portion of the substrate anneal chamber above the slit valve; and a top reflector disposed above the annular lamp assembly to reflect radiation downwards towards the lamp assembly.

In some embodiments, a method of processing a substrate includes: receiving a substrate to be processed; raising the substrate to a processing position; sputtering a sputtering target to deposit material on the substrate; and rapidly heating the substrate to anneal the material deposited on the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for processing a substrate are provided herein. In some embodiments, a substrate support pedestal is provided that advantageously allows for in situ annealing of a substrate, thus improving the throughput of the processing system by reducing downtime due to transferring of a substrate to an ex situ anneal chamber. Embodiments of the present disclosure further provide an anneal chamber that advantageously provides more uniform heating of a substrate. The inventive methods and apparatus advantageously improve throughput by reducing either the downtime required for transferring the substrate to an ex situ anneal chamber or by reducing the anneal time. The inventive substrate support pedestal may be coupled to existing substrate supports that function as electrostatic chucks to advantageously allow ease of switching between a pedestal having chucking electrodes to chuck a substrate and a pedestal that may be used to anneal a substrate as discussed herein.

Figure 1:
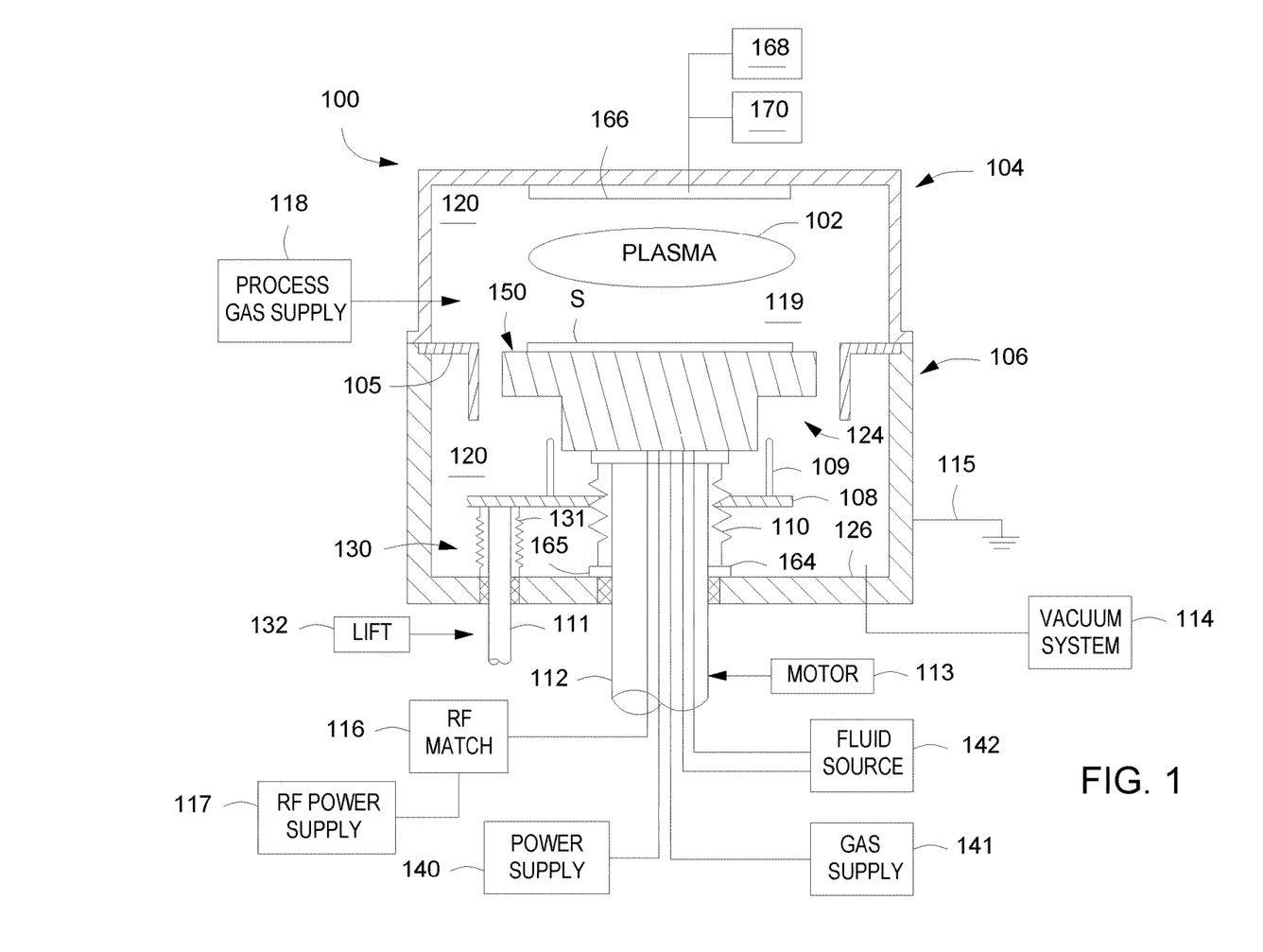
FIG. 1 depicts a schematic view of a process chamber having a rotatable substrate support in accordance with some embodiments of the present disclosure.

FIG. 1 is a schematic cross-sectional view of plasma processing chamber in accordance with some embodiments of the present disclosure. In some embodiments, the plasma processing chamber is a physical vapor deposition (PVD) processing chamber. However, other types of processing chambers can also use or be modified for use with embodiments of the inventive substrate support described herein.

The chamber 100 is a vacuum chamber which is suitably adapted to maintain sub-atmospheric pressures within a chamber interior volume 120 during substrate processing. The chamber 100 includes a chamber body 106 covered by a lid 104 which encloses a processing volume 119 located in the upper half of chamber interior volume 120. The chamber 100 may also include one or more shields 105 circumscribing various chamber components to prevent unwanted reaction between such components and ionized process material. The chamber body 106 and lid 104 may be made of metal, such as aluminum. The chamber body 106 may be grounded via a coupling to ground 115.

A substrate support 124 is disposed within the chamber interior volume 120 to support and retain a substrate S, such as a semiconductor wafer, for example, or other such substrate. The substrate support 124 may generally comprise a substrate support 150 (described in more detail below with respect to FIG. 2) and a hollow support shaft 112 for supporting the substrate support 150. The hollow support shaft 112 provides a conduit to provide, for example, process gases, fluids, coolants, power, or the like, to the substrate support 150.

In some embodiments, the hollow support shaft 112 is coupled to a motor 113 which acts as a rotation assembly to rotate the hollow support shaft 112 and, optionally, a vertical lift to provide vertical movement of the substrate support 150 between an upper, processing position (as shown in FIG. 1) and a lower, transfer position (not shown). A bellows assembly 110 is disposed about the hollow support shaft 112 and is coupled between the substrate support 150 and a bottom surface 126 of chamber 100 to provide a flexible seal that allows vertical motion of the substrate support 150 while preventing loss of vacuum from within the chamber 100. The bellows assembly 110 also includes a lower bellows flange 164 in contact with an o-ring 165 or other suitable sealing element which contacts bottom surface 126 to help prevent loss of chamber vacuum.

The hollow support shaft 112 provides a conduit for coupling a fluid source 142, a gas supply 141, a power supply 140, and RF sources (e.g., RF bias power supply 117) to the substrate support 150, when necessary. In some embodiments, the RF bias power supply 117 is coupled to the substrate support via a RF match network 116. In some embodiments, however, and as will be evident from the description below, some of the elements extending through the hollow support shaft 112 may be omitted when the substrate support is used, for example, for an anneal process as described below.

A substrate lift 130 may include lift pins 109 mounted on a platform 108 connected to a shaft 111 which is coupled to a second lift mechanism 132 for raising and lowering the substrate lift 130 so that the substrate "S" may be placed on or removed from the substrate support 150. The substrate support 150 includes thru-holes (described below) to receive the lift pins 109. A bellows assembly 131 is coupled between the substrate lift 130 and bottom surface 126 to provide a flexible seal which maintains the chamber vacuum during vertical motion of the substrate lift 130.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein.

In operation, for example, a plasma 102 may be created in the chamber interior volume 120 to perform one or more processes. The plasma 102 may be created by coupling power from a plasma power source (e.g., RF plasma power supply 170) to a process gas via one or more electrodes proximate to or within the chamber interior volume 120 to ignite the process gas and creating the plasma 102. In some embodiments, a bias power may also be provided from a bias power supply (e.g., RF bias power supply 117) to one or more electrodes (described below) disposed within the substrate support 150 via a capacitively coupled bias plate (described below) to attract ions from the plasma towards the substrate S.

In some embodiments, for example where the chamber 100 is a PVD chamber, a target 166 comprising a source material to be deposited on a substrate S may be disposed above the substrate and within the chamber interior volume 120. The target 166 may be supported by a grounded conductive portion of the chamber 100, for example an aluminum adapter through a dielectric isolator. In other embodiments, the chamber 100 may include a plurality of targets in a multi-cathode arrangement for depositing layers of different material using the same chamber.

A controllable DC power source 168 may be coupled to the chamber 100 to apply a negative voltage, or bias, to the target 166. The RF bias power supply 117 may be coupled to the substrate support 124 in order to induce a negative DC bias on the substrate S. In addition, in some embodiments, a negative DC self-bias may form on the substrate S during processing. In some embodiments, an RF plasma power supply 170 may also be coupled to the chamber 100 to apply RF power to the target 166 to facilitate control of the radial distribution of a deposition rate on substrate S. In operation, ions in the plasma 102 created in the chamber 100 react with the source material from the target 166. The reaction causes the target 166 to eject atoms of the source material, which are then directed towards the substrate S, thus depositing material.

Figure 2:
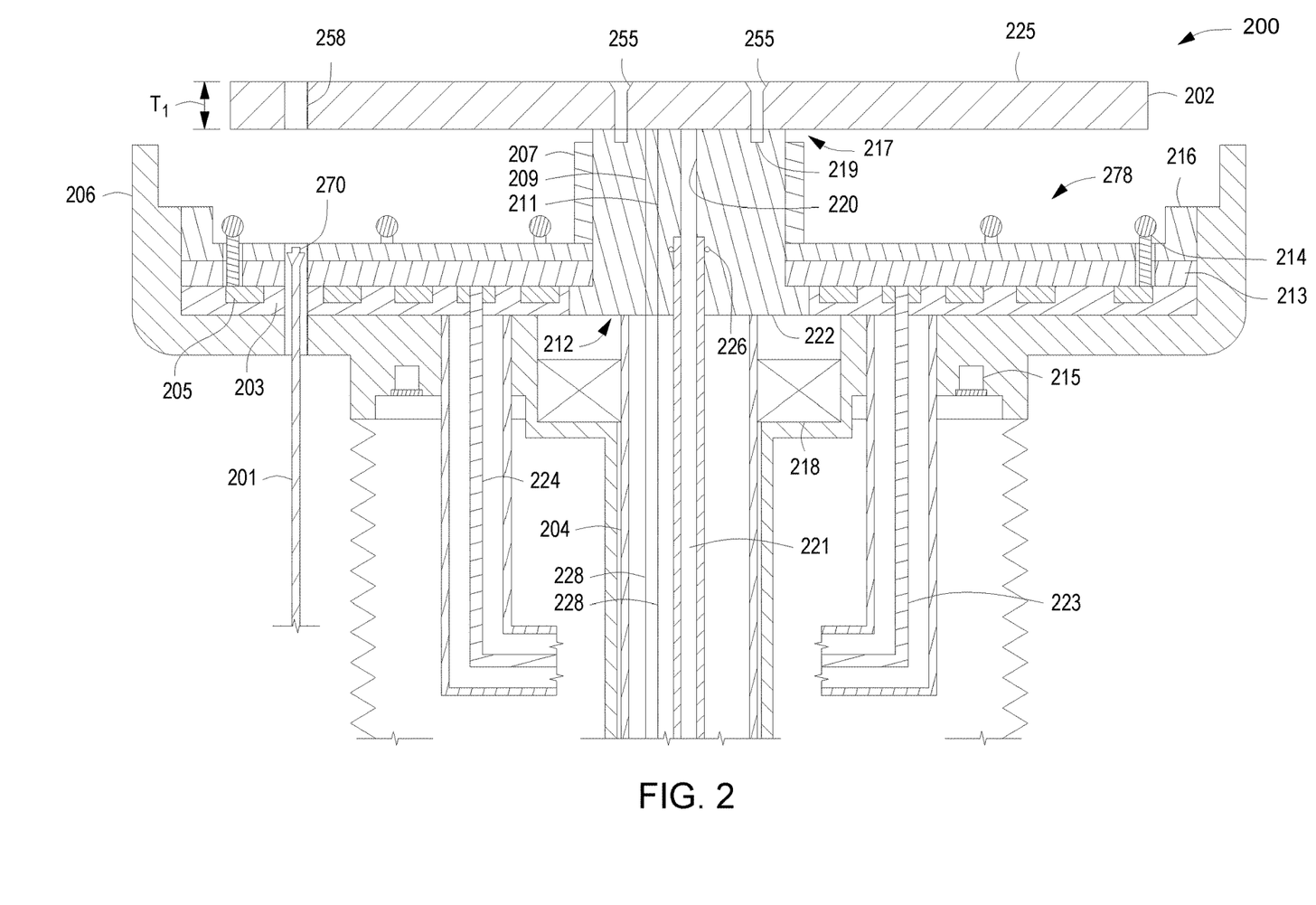
FIG. 2 depicts a cross-sectional view of an upper portion of a rotatable substrate support in accordance with some embodiments of the present disclosure.

FIG. 2 depicts cross-sectional view of a top portion of a substrate support 200 in accordance with some embodiments of the present disclosure. The substrate support 200 may be used as the substrate support 124 shown in FIG. 1. The substrate support 200 includes a substrate support pedestal 202, a shaft 204 extending from the bottom of the substrate support pedestal 202, and a housing 206 enclosing the substrate support pedestal 202, the shaft 204, and all the components (described below) of the substrate support 200.

The substrate support pedestal 202 is formed of a material that is transparent to radiation used to heat the substrate during processing so that a substrate disposed atop an upper surface 225 of the substrate support pedestal 202 may be heated without the substrate support pedestal 202 absorbing most of the heat. Because conventional pedestals absorb a significant amount of heat, a cold substrate that is placed on a previously heated pedestal is immediately heated by the pedestal. As a result, a process that requires a low temperature may not be performed until the pedestal cools down. However, because the inventive pedestal allows heat to pass through the pedestal, a low temperature process may be performed shortly after annealing has been performed on the inventive pedestal. Furthermore, a temperature ramp rate of the annealing of the substrate is significantly increased and may be between about 22° C./second and about 35° C./second. In some embodiments, substrate support pedestal 202 may be a quartz plate. In some embodiments, the substrate support pedestal 202 may have a thickness $T_1$ between about 5 mm and about 7 mm.

The substrate support 200 may also include a bearing 218 located proximate to the substrate support pedestal 202 (for example, within about 3 inches of the substrate support pedestal 202) to provide increased rigidity to the substrate support 200 during rotation. The bearing 218 may include, for example, a cross roller bearing, or the like.

To facilitate heating of the substrate disposed on the substrate support pedestal 202 the substrate support 200 includes a lamp assembly 278, which includes a plurality of lamps 214. In some embodiments, the lamp assembly 278 may include a reflective plate 216 formed of or coated with a reflective material to reflect heat upwards towards the substrate support pedestal 202. For example, the reflective plate 216 may be formed of polished aluminum or stainless steel. The plurality of lamps 214 includes any number and type of lamp capable of emitting enough heat to heat the substrate support pedestal 202 via radiation. For example, the plurality of lamps 214 may include halogen lamps. In some embodiments, the total power output of the plurality of lamps 214 is between about 2.25 kilowatts (kW) and about 9.5 kW.

The plurality of lamps 214 receive power from a plurality of conductors 205 disposed in a dielectric plate 203, such as a ceramic plate. The conductors 205 may receive power from the power supply 140 or from another power supply (not shown) via heater power lines (e.g., conductors) 223, 224. In some embodiments, a dielectric layer 213 may be disposed atop the dielectric plate 203 to protect the conductors 205 and prevent inadvertent contact between the conductors 205 and any other conductive elements of the substrate support 200. Openings in the dielectric layer 213 are provided to facilitate coupling the conductors 205 to respective lamps 214. In some embodiments, the plurality of lamps may be divided into a plurality of zones, for example, an inner array of lamps and an independently controllable outer array of lamps.

As explained above, upon activation of the plurality of lamps 214, heat is generated and a substrate disposed on the substrate support pedestal 202 is heated. Because the heat is emitted in every direction, a plurality of fluid channels 215 are formed in the housing 206 to keep the housing 206 cool. Any suitable coolant (e.g., water, propylene glycol, or the like) may be flowed through the fluid channels 215 to cool the housing 206.

In order to facilitate placement and removal of a substrate on the substrate support pedestal 202, the substrate support 200 may also include a lift pin assembly including a plurality of lift pins 201 to raise and lower a substrate off of or onto the substrate support pedestal 202. In some embodiments, at least one of the plurality of lift pins 201 may include a pyrometer to measure the temperature of the substrate support pedestal 202. However, the pyrometer may be disposed in any other location suitable to measure the temperature of the substrate.

The substrate support 200 further includes a pedestal support 222, to which the substrate support pedestal 202 is removably coupled. In some embodiments, the pedestal support 222 includes a plurality of electrical taps (two shown 209, 211) corresponding and coupled to the plurality of chucking power lines 228. The plurality of electrical taps may be coupled to chucking electrodes in a pedestal used to electrostatically chuck a substrate. However, in embodiments where there are no chucking electrodes in the substrate support pedestal 202, the plurality of electrical taps are not coupled to anything and are, therefore, not used.

In some embodiments, a metallic sleeve 207 may be disposed about the pedestal support 222 to shield the plurality of electrical taps from radiation emitted by the plurality of lamps 214. In some embodiments, the metallic sleeve may be formed of aluminum. In some embodiments, the pedestal support 222 may be formed of aluminum oxide.

In some embodiments, the pedestal support 222 may include a central channel 220 disposed through the pedestal support 222 from a first end 217 to a second end 212 for providing backside gases when such gases are needed. However, in substrate support pedestal 202 illustrated in FIG. 2, backside gases are not utilized and, as such, the substrate support pedestal 202 does not include openings to allow backside gases to pass from the central channel 220 through the substrate support pedestal 202. The central channel 220 is fluidly coupled to a conduit 221 which is disposed within the shaft 204 and fluidly coupled to the gas supply 141. In some embodiments, a dynamic seal o-ring 226 is disposed between the outer wall of the conduit 221 and the inner wall of the central channel 220. The dynamic seal o-ring 226 provides a dynamic seal to prevent leakage of any backside gases during rotation of the pedestal support 222 about the conduit 221, which is stationary. In embodiments where not used, the central channel 220 and the conduit 221 need not be provided. However, provision of the central channel 220 and the conduit 221 facilitate rapid switching between the substrate support pedestal 202 and other supports, such as an electrostatic chuck, without removal of the entire substrate support 200 from the process chamber.

The pedestal support 222 is coupled to a bottom surface of the substrate support pedestal 202 at the first end 217 and to the shaft 204 at the second end 212. The pedestal support 222 supports the substrate support pedestal 202 in a spaced apart relation to the plurality of lamps 214. As explained above, the substrate support pedestal 202 is removably coupled to the substrate support so that switching between different pedestals is relatively simple. As such, in some embodiments, the substrate support pedestal 202 may include a plurality of mounting holes 255 extending through the substrate support pedestal 202 to accommodate a corresponding plurality of fixation elements (such as bolts, screws, clamps, or the like) to advantageously facilitate coupling the substrate support pedestal 202 to the pedestal support 222 in a more easily removable and replaceable manner. The pedestal support 222 includes a plurality of blind holes 219 corresponding to the plurality of mounting holes 255 to receive ends of the fixation elements to facilitate the coupling. The substrate support pedestal 202 further includes a plurality of lift pin holes 258 through which lift pins 201 extend to lift a substrate off of the substrate support pedestal 202 or receive a substrate to be processed.

Figure 3:
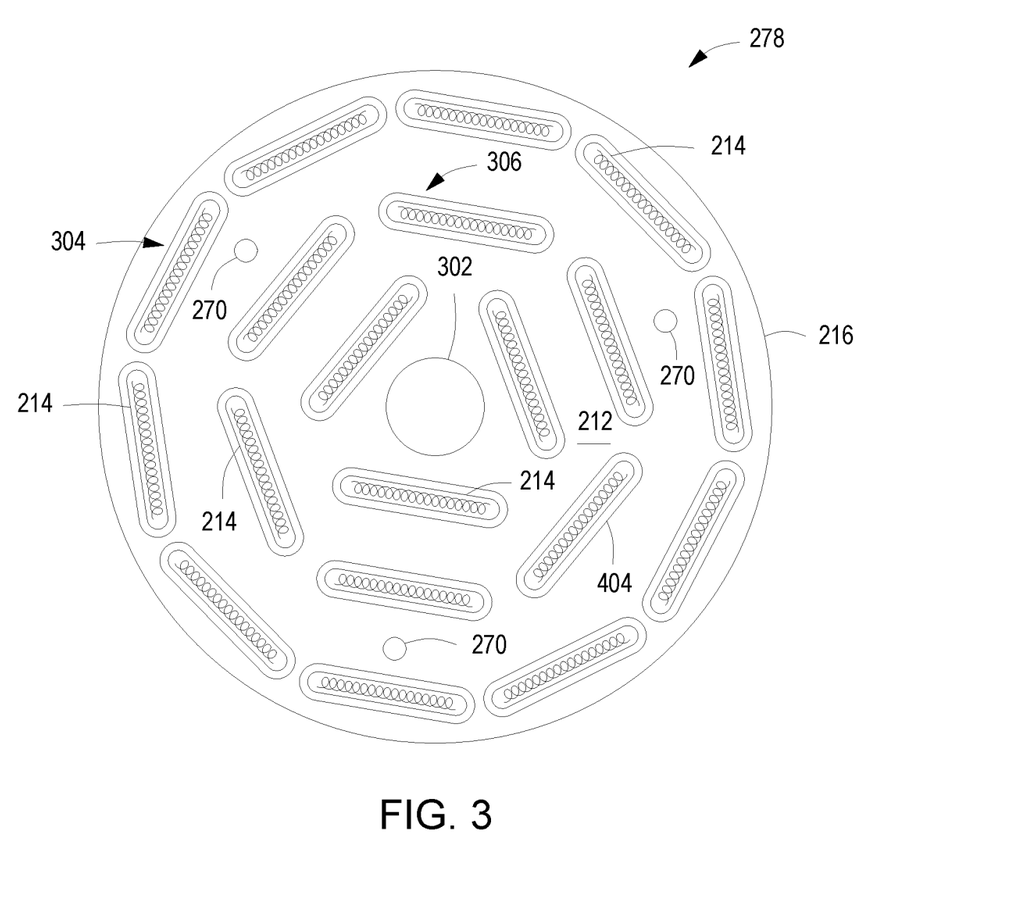
FIG. 3 depicts a top view of a substrate heating apparatus in accordance with some embodiments of the present disclosure.

FIG. 3 depicts a top view of the lamp assembly 278 having the plurality of lamps 214. As explained above, the plurality of lamps 214 heat the substrate disposed atop the substrate support pedestal 202. The lamp assembly 278 also includes a central hole 302 through which the pedestal support 222 extends and the plurality of holes 270 to allow the plurality of lift pins 201 to pass through the lamp assembly 278. Although shown in a particular configuration, the shape and number of the lamps may be varied to provide a desired heat profile on the substrate support pedestal 202. In some embodiments, the plurality of lamps 214 includes an inner array of lamps 306 and an independently controllable outer array of lamps 304.

Figure 4:
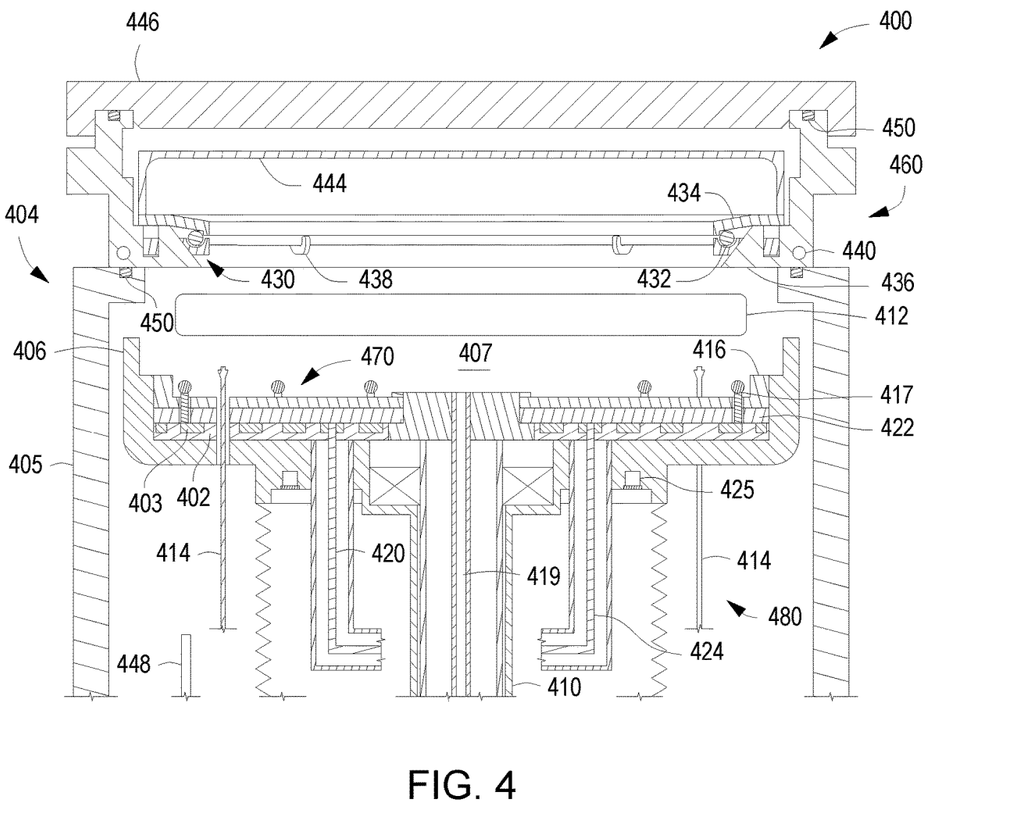
FIG. 4 depicts a schematic cross-sectional view of an anneal chamber in accordance with some embodiments of the present disclosure.

FIG. 4 depicts a cross-sectional view of a substrate anneal chamber 400 in accordance with some embodiments of the present disclosure. The substrate anneal chamber 400 can be configured to be mounted to a cluster tool and, in some embodiments, is mounted to a cluster tool having another process chamber, such as a physical vapor deposition chamber, also mounted thereto to advantageously facilitate transfer of substrates from the deposition chamber to the anneal chamber quickly and without exposure to atmosphere.

In some embodiments, the substrate anneal chamber 400 includes a chamber body 404 having a chamber wall 405, an upper heating assembly 460 disposed atop the chamber wall 405, and an interior volume 407. A support assembly 480 is disposed within the interior volume 407. In some embodiments, the support assembly 480 includes a lamp assembly 470 having a plurality of lamps 417 disposed on a shaft 410. To facilitate the transfer of a substrate into and out of the substrate anneal chamber 400, a slit valve 412 is formed in the chamber wall 405 above the lamp assembly 470. A plurality of lift pins 414 extend through the lamp assembly 470 to support the substrate in a spaced apart relation to the plurality of lamps 417.

In some embodiments, the upper heating assembly 460 includes an annular lamp assembly 430 disposed in an upper portion of the substrate anneal chamber 400 above the slit valve 412. The annular lamp assembly 430 includes at least one lamp 432 disposed between an upper annular reflector 434 and a lower annular reflector 436. In some embodiments, the upper annular reflector 434 is disposed on the lower annular reflector 436, which is supported by the chamber wall 405. In use, radiation is emitted by the at least one lamp 432 in every direction. Radiation that is emitted towards the lower annular reflector 436 is reflected upwards towards the upper annular reflector 434, which reflects the radiation downwards towards a substrate disposed atop the plurality of lift pins 414.

In some embodiments, the at least one lamp 432 is supported using a plurality of hook-shaped arms 438 extending from the upper annular reflector 434. The upper and lower annular reflectors 434, 436 are configured to reflect radiation from the at least one lamp 432 towards a substrate disposed atop the plurality of lift pins 414. To facilitate the reflectivity of the annular reflectors, the upper and lower annular reflectors may be formed of a polished material, such as, for example, stainless steel. In embodiments in which the operating temperature of the substrate anneal chamber 400 is less than 600° C., the annular reflectors may alternatively be formed of aluminum. In some embodiments, the lower annular reflector may include an annular coolant channel 440 through which a coolant is flowed to maintain the temperature of the lower annular reflector at or below a desired temperature. In some embodiments, the substrate anneal chamber may include at least one pyrometer 448 configured to measure the temperature of a substrate disposed atop the plurality of lift pins 414 to provide feedback to control the annealing process.

In some embodiments, the upper heating assembly 460 further includes a top reflector 444 disposed above the annular lamp assembly 430 and configured to reflect radiation downwards towards a substrate disposed atop the plurality of lift pins 414 (i.e., towards the lamp assembly 470). The top reflector 444 and the chamber wall 405 define the interior volume 407 of the substrate anneal chamber 400. A cap 446 may be disposed atop the upper heating assembly 460 to serve as a barrier between the potentially high temperature components of the upper heating assembly 460 and the surrounding environment. A plurality of o-rings 450 may be disposed at interfaces of the various components (e.g., between the upper heating assembly 460 and the chamber wall 405, between the cap 446 and the upper heating assembly 460, etc.) to ensure a proper seal between the components.

The remainder of the support assembly 480 is similar to the substrate support 200 described above. For example, in some embodiments, the plurality of lamps 417 receive power from a plurality of conductors 403 disposed in a dielectric plate 402, such as a ceramic plate. The conductors 403 may receive power from a power supply (not shown, but similar to the power supply 140) or from another power supply (not shown) via heater power lines (e.g., conductors) 420, 424. In some embodiments, a dielectric layer 422 may be disposed atop the dielectric plate 402 to protect the conductors 403 and prevent inadvertent contact between the conductors 403 and any other conductive elements of the support assembly 480. The support assembly 480 may also include coolant channels 425 through which coolant is flowed to maintain the temperature of the support assembly 480 at a desired temperature.

The lamp assembly 470 is substantially similar to the lamp assembly 278 discussed above and shown in FIG. 3. As such, further discussion of the lamp assembly 470 will be omitted here for brevity.

Figure 4A:
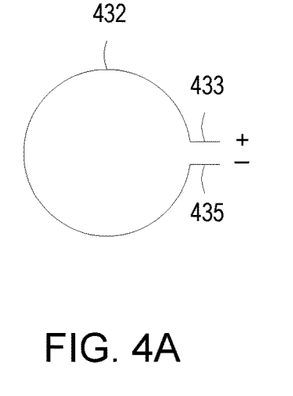
FIGS. 4A-B depict schematic views of an annular lamp for use in an anneal chamber in accordance with some embodiments of the present disclosure.
Figure 4B:
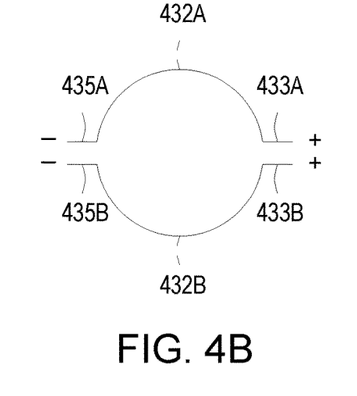

FIGS. 4A and 4B depict schematic views of the at least one lamp 432 in accordance with some embodiments of the present disclosure. In some embodiments, and as depicted in FIG. 4A, the at least one lamp may include one annular lamp 432 having a positive lead 433 and a negative lead 435 to be coupled to respective positive and negative terminals of a power source (not shown). In some embodiments, and as depicted in FIG. 4B, the at least one lamp may alternatively include two semicircular lamps 432A and 432B having respective positive leads 433A, 433B and negative leads 435A, 435B.

Figure 5:
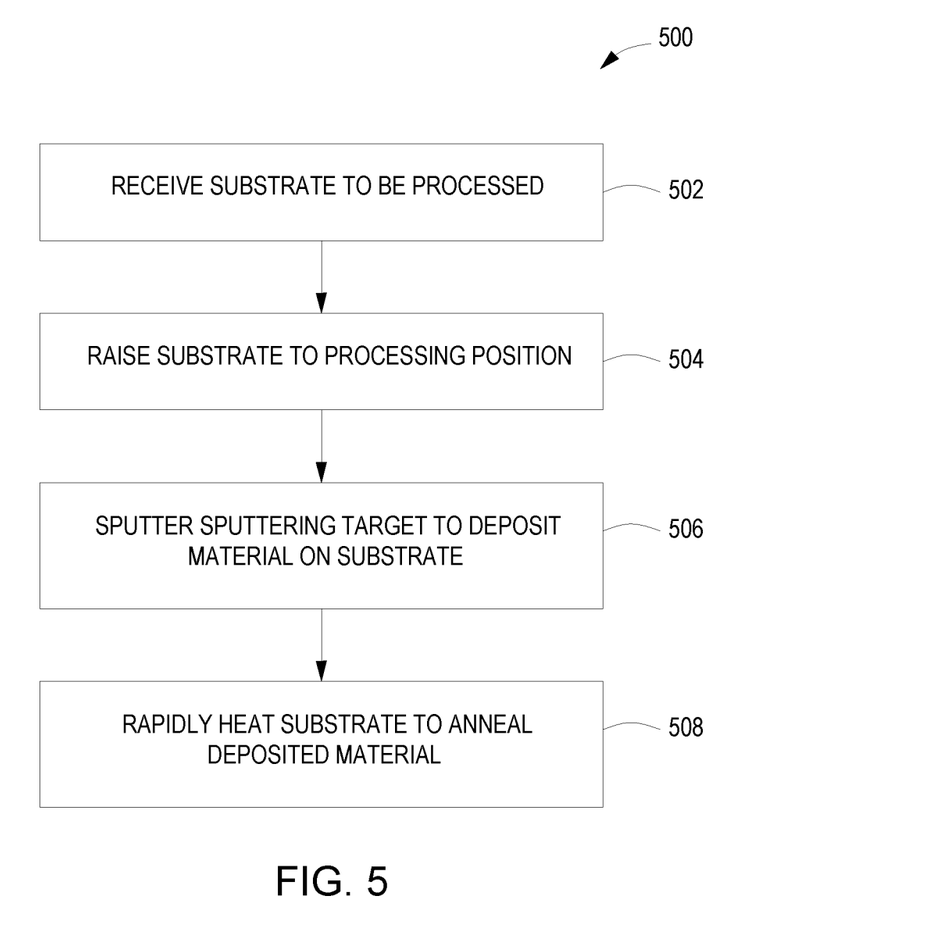
FIG. 5 is a flowchart depicting a method of processing a substrate in accordance with some embodiments of the present disclosure.

FIG. 5 is a flowchart depicting a method 500 of processing a substrate in accordance with some embodiments of the present disclosure. At 502, a substrate to be processed is received on the substrate support in a process chamber (e.g., chamber 100). At 504, the substrate is raised to a processing position. At 506, at least one sputtering target is sputtered to deposit material on the substrate. At 508, the substrate is rapidly heated to anneal the material deposited on the substrate.

In some embodiments, the sputtering and the rapid heating are performed in the same chamber. For example, as explained above with regard to the substrate support 200, the substrate support pedestal 202 is formed of a material that is transparent to radiation (e.g., quartz) and the substrate is heated by the plurality of lamps 214 disposed beneath the substrate support pedestal 202. As such, a substrate may be processed and then annealed in the same chamber even if the process temperature is low (e.g., at or near room temperature).

In some embodiments, the sputtering and the rapid heating are performed in different chambers. For example, and as explained above with regard to the substrate anneal chamber 400, the substrate is transferred to the substrate anneal chamber 400 and is heated from above using the annular lamp assembly 430 disposed above the substrate and from below using the plurality of lamps 417 disposed beneath the substrate. A plurality of reflectors (e.g., upper reflector 434, lower reflector 436, top reflector 444, and lamp assembly reflective plate) are configured to reflect radiation towards the substrate.

While the foregoing is directed to embodiments of the present disclosure, other and further embodiments of the disclosure may be devised without departing from the basic scope thereof.

The invention claimed is:

1. A substrate support, comprising:
a substrate support pedestal having an upper surface to support a substrate and an opposing bottom surface;
a lamp assembly disposed below the substrate support pedestal and having a plurality of lamps configured to emit radiation to heat the substrate, wherein the lamp assembly includes a central hole, and wherein the substrate support pedestal is formed of a material that is transparent to the radiation emitted by the plurality of lamps to heat the substrate;
a pedestal support extending through the central hole and coupled to the bottom surface of the substrate support pedestal at a first end of the pedestal support to support the substrate support pedestal in a spaced apart relation to the plurality of lamps, wherein the pedestal support is fixedly coupled to the plurality of lamps to support the substrate support pedestal in a vertically fixed spaced apart relation to the plurality of lamps;
a shaft coupled to a second end of the pedestal support opposite the first end; and
a rotation assembly coupled to the shaft opposite the pedestal support to rotate the shaft, the pedestal support, and the substrate support pedestal with respect to the lamp assembly.

2. The substrate support of claim 1, wherein the substrate support pedestal is formed of quartz.

3. The substrate support of claim 1, wherein substrate support pedestal has a thickness between about 5 mm and about 7 mm.

4. The substrate support of claim 1, wherein the substrate support pedestal further comprises:
a plurality of mounting holes configured to receive a corresponding plurality of fixation elements to couple the substrate support pedestal to the pedestal support.

5. The substrate support of claim 1, wherein the plurality of lamps includes halogen lamps and has a total power output between about 2.25 kW and about 9.5 kW.

6. The substrate support of claim 1, wherein the plurality of lamps includes an inner array of lamps and an independently controllable outer array of lamps.

7. The substrate support of claim 1, wherein the lamp assembly includes a reflective plate disposed beneath the plurality of lamps and configured to reflect radiation from the plurality of lamps towards the substrate support pedestal.

8. A substrate anneal chamber, comprising:
a chamber body having a chamber wall and an interior volume;
a lamp assembly disposed in the interior volume and having a plurality of lamps configured to heat a substrate, wherein the lamp assembly is coupled to a shaft which supports the lamp assembly;
a plurality of lift pins extending through the lamp assembly to support the substrate in a spaced apart relation to the plurality of lamps;
a slit valve disposed through a wall of the chamber body and above the lamp assembly to allow the substrate to pass into and out of the interior volume;
an annular lamp assembly having at least one lamp disposed between an upper annular reflector and a lower annular reflector in the interior volume in an upper portion of the substrate anneal chamber above the slit valve, and wherein the upper annular reflector is disposed on an upper surface of the lower annular reflector; and
a top reflector disposed above the annular lamp assembly to reflect radiation downwards towards the lamp assembly.

9. The substrate anneal chamber of claim 8, wherein the lower annular reflector is coupled to a cap disposed above the annular lamp assembly.

10. The substrate support of claim 1, wherein the pedestal support includes a cylindrical body and a flange extending radially outward from a lower surface of the cylindrical body.

* * * * *